(12) United States Patent
Jeong et al.

(10) Patent No.: US 6,614,688 B2
(45) Date of Patent: Sep. 2, 2003

(54) METHOD OF PROGRAMMING NON-VOLATILE SEMICONDUCTOR MEMORY DEVICE

(75) Inventors: Jae-Yong Jeong, Kyunggi-do (KR);
Jin-Seon Yeom, Kyunggi-do (KR);
Sung-Soo Lee, Kyunggi-do (KR)

(73) Assignee: Samsung Electronic Co. Ltd., Suwon (KR)

( * ) Notice: Subject to any disclaimer, the term of this patent is extended or adjusted under 35 U.S.C. 154(b) by 0 days.

(21) Appl. No.: 09/990,191

(22) Filed: Nov. 20, 2001

(65) Prior Publication Data

US 2002/0118569 A1 Aug. 29, 2002

(30) Foreign Application Priority Data

Dec. 28, 2000 (KR) .......................................... 2000-83619

(51) Int. Cl.[7] .............................................. G11C 16/04
(52) U.S. Cl. .......................... 365/185.18; 365/185.27; 365/185.05; 365/185.28
(58) Field of Search ....................... 365/185.18, 185.27, 365/185.05, 185.28

(56) References Cited

U.S. PATENT DOCUMENTS

| | | | |
|---|---|---|---|
| 5,546,341 A | | 8/1996 | Suh et al. |
| 5,657,271 A | * | 8/1997 | Mori ..................... 365/185.27 |
| 5,677,873 A | | 10/1997 | Choi et al. |
| 5,715,194 A | | 2/1998 | Hu |
| 5,790,456 A | * | 8/1998 | Haddad .................. 365/185.17 |
| 5,912,845 A | * | 6/1999 | Chen et al. ............... 365/185.3 |
| 5,991,202 A | | 11/1999 | Derhacobian et al. |
| 6,009,017 A | * | 12/1999 | Guo et al. .............. 365/185.28 |
| 6,055,190 A | * | 4/2000 | Lu et al. ................. 365/185.22 |
| 6,061,270 A | | 5/2000 | Choi |
| 6,215,700 B1 | * | 4/2001 | Fong et al. ............... 365/185.1 |

* cited by examiner

Primary Examiner—Vu A. Le
Assistant Examiner—Nam Nguyen
(74) Attorney, Agent, or Firm—Marger Johnson & McCollom, P.C.

(57) ABSTRACT

A method of programming a non-volatile semiconductor memory device is provided. The method includes a bitline setup step, a well bias setup step, a program step, and a discharge step. In the bitline setup step, either a ground or power supply voltage is supplied respectively to bitlines according to data bits stored in page buffers, and a pocket P-well area is biased with the ground voltage. In the well bias setup step, the ground voltage applied to the pocket P-well area is cut off to make the second well area attain a floating state. Under such a condition, the pocket P-well area is biased with a coupling voltage, which is lower than the ground voltage, through a coupling capacitance between the pocket P-well area and a common source line, or a coupling capacitance between the pocket P-well area and an N-well area. In the program step, a program voltage is supplied to selected wordlines and a pass voltage is supplied to unselected wordlines, with the floating second well area biased with the coupling voltage. Therefore, the pocket P-well area is biased with a negative voltage through the capacitance coupling.

40 Claims, 13 Drawing Sheets

METHOD OF PROGRAMMING NON-VOLATILE SEMICONDUCTOR MEMORY DEVICE

TECHNICAL FIELD

The present invention generally relates to a semiconductor memory device, and more specifically, is directed to a method of programming a non-volatile semiconductor memory device capable of cutting off a leakage current flowing through a parasitic MOS transistor formed between adjoining memory cells of the same row, and a leakage current flowing through a string select transistor.

BACKGROUND OF THE INVENTION

This application relies for priority upon Korean Patent Application No. 2000-083619, filed on Dec. 28, 2000, the contents of which are herein incorporated by reference in their entirety.

There is a need to electrically erase and program semiconductor memory devices without refreshing data stored within the semiconductor memory device. Also, there is a continuing need to increase storage capacity and integration level of the memory devices. A NAND-type flash memory device is one example of non-volatile memory devices that can provide mass storage capacity and a high integration level without refresh of data stored therein. Since such a flash memory is able to retain data even in power-off state, it has widely been used in electric apparatuses (e.g., mobile telephones, portable computers, Personal Digital Assistants, digital cameras, and so forth).

A non-volatile memory device such as a NAND-type flash memory includes electrically erasable and programmable read only memory cells, which are called "flash EEPROM cells". Conventionally, a flash memory cell includes a cell transistor or a floating gate transistor. The transistor, which is formed at a pocket P-well area as a substrate, includes N-type source and drain regions spaced out a predetermined distance apart from each other, a floating gate located on a channel region between the source and drain regions to store charges, and a control gate located on the floating gate.

Referring now to FIG. 12, an array configuration of a conventional NAND-type flash memory device is illustrated. A memory cell array is formed at a pocket P-well area, and includes a plurality of cell strings 10 each corresponding to bitlines. The pocket P-well area is formed in an N-well area of a P-type semiconductor substrate (see FIG. 2). For simplicity of the drawing, there are shown only two bitlines BL0 and BL1 and two cell strings 10 corresponding thereto. Each of the cell strings 10 is made of a string select transistor (SST) as a first select transistor, a ground select transistor (GST) as a second select transistor, and a plurality of flash EEPROMs (MCm (m=0–15)) serially coupled between the select transistors. SST and GST. The string select transistor SST has a drain coupled to a corresponding bitline, and a gate coupled to a string select line SSL. The ground select transistor GST has a source coupled to a common source line CSL, and a gate coupled to a ground select line GSL. The flash EEPROM cells MC15–MC0 are serially coupled between a source of the string select transistor SSL and a drain of the ground select transistor GSL, and have gates coupled to corresponding wordlines WL15–WL0, respectively.

Initially, flash EEPROM cells of a memory cell array are erased to have a threshold voltage of, for example, −3 V. For programming the flash EEPROM cells, a high voltage Vpgm is applied to a selected wordline and a pass voltage Vpass is applied to an unselected wordline. Thus, a threshold voltage of a selected memory cell is boosted, while threshold voltages of the other (unselected) memory cells are not changed.

If it is desired to not program unselected flash EEPROM cells coupled to the selected wordline while programming selected memory cell(s) coupled to the same wordline, problems occur.

When a program voltage is applied to the selected wordline, the program voltage is applied to not only the selected flash EEPROM cell but also unselected flash EEPROM cells arranged along the same wordline. The unselected flash EEPROM cell coupled to the wordline, particularly, a flash EEPROM cell adjacent to the selected cell is programmed. Inadvertent programming of an unselected cell coupled to a selected wordline is called "program disturb".

One of technologies for preventing the program disturb is a program inhibit method using a self-boosting scheme, which is disclosed in U.S. Pat. No. 5,677,873 entitled "METHOD OF PROGRAMMING FLASH EEPROM INTEGRATED CIRCUIT MEMORY DEVICE TO PREVENT INADVERTENT PROGRAMMING OF NONDESIGNATED NAND MEMORY CELLS THEREIN", and U.S. Pat. No. 5,991,202 entitled "METHOD FOR REDUCING PROGRAM DISTURB DURING SELF-BOOSTING IN A NAND FLASH MEMORY".

An operation timing view based upon the foregoing program inhibit method using the self-boosting scheme is illustrated in FIG. 13. A voltage of 0 V is applied to a gate of a ground select transistor GST, cutting off a ground path. A voltage of 0 V is applied to a selected bitline (e.g., BL0), and a power supply voltage VCC of 3.3 V or 5 V is applied to an unselected bitline (e.g., BL1). At the same time, the power supply voltage VCC is applied to a gate of a string select transistor SST coupled to a bitline BL1 (see FIG. 12), charging a source of the string select transistor SST (or a channel of a program inhibit cell transistor) up to VCC-Vth (here, Vth denotes a threshold voltage of the string select transistor SST). The string select transistor SST is substantially shut off. This interval is called "bitline setup interval".

Then, a program voltage Vpgm is applied to a select wordline and a pass voltage Vpass is applied to unselect wordlines, boosting a channel voltage Vchannel of a program inhibit cell transistor. Fowler-Nordheim (F-N) tunneling is not created between a floating gate and a channel, so that the program inhibit cell transistor retains an initial erase state. This interval is called "program interval". If programming the selected memory cell is completed, a discharge operation is carried out to discharge a potential of a bitline. For the bitline setup, program, and discharge intervals, a pocket PPWELL area and an N-well NWELL are biased with a ground voltage, as shown in FIG. 13.

When the foregoing program inhibit method using the self-boosting scheme is employed on a flash memory device, unfortunately, one problem occurs. The higher the integration level of the flash memory device is, the narrower the spacing between adjoining signal lines is. This causes a signal line coupling through a parasitic capacitance (see FIG. 12) that is created between adjoining signal lines. For example, assume that a memory cell MC15 adjacent to (or located beneath) the string select transistor SST is programmed. When a program voltage is applied to a select wordline WL15 coupled to the memory cell MC15, a voltage (e.g., power supply voltage) of the string select line SSL is boosted higher than a power supply voltage VCC, due to a coupling to a select wordline WL15 through a parasitic capacitance, as shown in FIG. 13. The voltage boosting makes charges in the channel of the program inhibit cell transistor discharged to a bitline through a string select transistor (which is changed from a shut-off state to a turn-on state by the voltage boosting). In other words, the channel voltage Vchannel (or inhibit voltage Vinhibit) of the program inhibit cell transistor is lowered as much as $\Delta V$ (determined by a coupling ratio of a wordline to a string select line and a program voltage) in proportion to the boosting voltage of the string select line SSL, as shown in FIG. 13. Therefore, the program inhibit cell transistor is inadvertently programmed (i.e., program disturb occurs).

Another problem is caused by employing the foregoing program inhibit scheme. That is, "program disturb" occurs in a program inhibit flash EEPROM cell that is adjacent to a flash EEPROM cell to be programmed by a leakage current flowing through a parasitic MOS transistor. This will now be explained in detail hereinbelow.

With reference to FIG. 14 illustrating a cross-sectional view of an array configuration taken along line a dotted line A–A' of FIG. 12, flash EEPROM cells coupled to the same wordline WL14 are electrically isolated from each other by field (or field oxide) zones 12 formed in a pocket P-well region. A parasitic MOS transistor is made of adjoining flash EEPROM cells, a wordline WL14, and a pocket P-well as a bulk. A channel region of a program inhibit cell out of the EEPROM cells acts as a drain region of the parasitic MOS transistor. A channel region of a program cell acts as a source region. The wordline WL14 acts as a gate of the parasitic MOS transistor. A pocket P-well region, which is adjacent to the field zone 12 between the source and drain regions, acts as the channel region of the parasitic MOS transistor.

If a program voltage Vpgm applied to the wordline W14 is higher than a threshold voltage of the parasitic MOS transistor, the parasitic MOS transistor is turned on. This makes a leakage current flow from the channel region of the program inhibit cell to the channel region of the program cell through the turned-on MOS transistor. A self-boosted channel voltage of the program inhibit cell is then lowered, so that the program inhibit flash EEPROM cell suffers from "program disturb".

A threshold voltage of a parasitic MOS transistor is boosted to solve such a problem. In order to boost a threshold voltage of a parasitic MOS transistor, a method of implanting impurities into a field zone has been suggested. Unfortunately, a breakdown voltage of a drain region is lowered. Furthermore, to increase an impurity concentration is to be restrictive with a trend toward decreasing the size of a memory cell array. Also, a method of directly biasing a pocket P-well area with a negative voltage has been suggested. Unfortunately, it takes a relatively long time to charge the pocket P-well area, thereby increasing the total programming time.

SUMMARY OF THE INVENTION

Embodiments of the present invention provide a method of programming a non-volatile semiconductor memory device that can prevent program disturb by boosting threshold voltages of a string select transistor and a parasitic MOS transistor formed between adjoining memory cells of the same row.

According to an aspect of the present invention, a method of programming a non-volatile semiconductor memory device in order to prevent a leakage current from flowing through a string select transistor and a parasitic MOS transistor formed between a program inhibit cell and a program cell is provided. The memory device is made of a semiconductor substrate of a first conductive type (e.g., P-type); a first well area of a second conductive type (e.g., N-type) formed at the semiconductor substrate of the first conductive type; a second well area of the first conductive type formed in the first well area; a memory cell array formed at the second well area, and composed of a plurality of strings each being made of a first select transistor having a drain connected to a corresponding bitline, a second select transistor having a source connected to a common source line, and a plurality of memory cells serially connected between a source of the first select transistor and a drain of the second select transistor; a first select line commonly connected to first select transistors of the strings; a second select line commonly connected to second select transistors of the strings; a plurality of wordlines each being connected to memory cells of the respective strings; and page buffers, each being coupled to bitlines corresponding to the respective strings, for temporarily storing data to be programmed in the memory cell array. In the programming method, either a ground or power supply voltages is applied to each of the bitlines depending upon data bits stored in the page buffers, with the second well area biased with the ground voltage. The ground voltage applied to the second well area is cut off so that the second well area holds a floating state. Under this condition, the second well area is biased with a coupling voltage lower than the ground voltage through either a coupling capacitance between the second well area and the common source line, or a coupling capacitance between the second well area and the first well area. With the floated second well area biased with the coupling voltage, a program voltage is applied to a selected one of the wordlines, and a pass voltage is applied to unselected wordlines.

DESCRIPTION OF THE PREFERRED EMBODIMENT

A NAND-type flash memory device of the present invention includes a memory cell array that is formed in a pocket P-well area. A program cycle of the memory device is composed of a bitline setup interval, a well bias setup interval, a program interval, and a discharge interval. It is apparent to those skilled in the art that the program cycle is repeated within the predetermined times. In the bitline setup interval, bitlines are charged to either a power supply voltage or a ground voltage according to data bits that are loaded in respective page buffers. After the bitline setup interval and before the program interval, the pocket P-well area is biased with a negative voltage through a capacitance coupling for a short time, and then allowed to float. The pocket P-well area is biased with the negative voltage, increasing in threshold voltages of parasitic MOS and string select transistors between adjoining memory cells. This implies that a leakage current flowing through the parasitic MOS and string select transistors can be cut off. Thus, it is possible to prevent program disturb that occurs when a program voltage is applied to a wordline adjacent to a string select line, as well as program disturb that is caused by a turn-on phenomenon of a parasitic MOS transistor.

Figure 1:
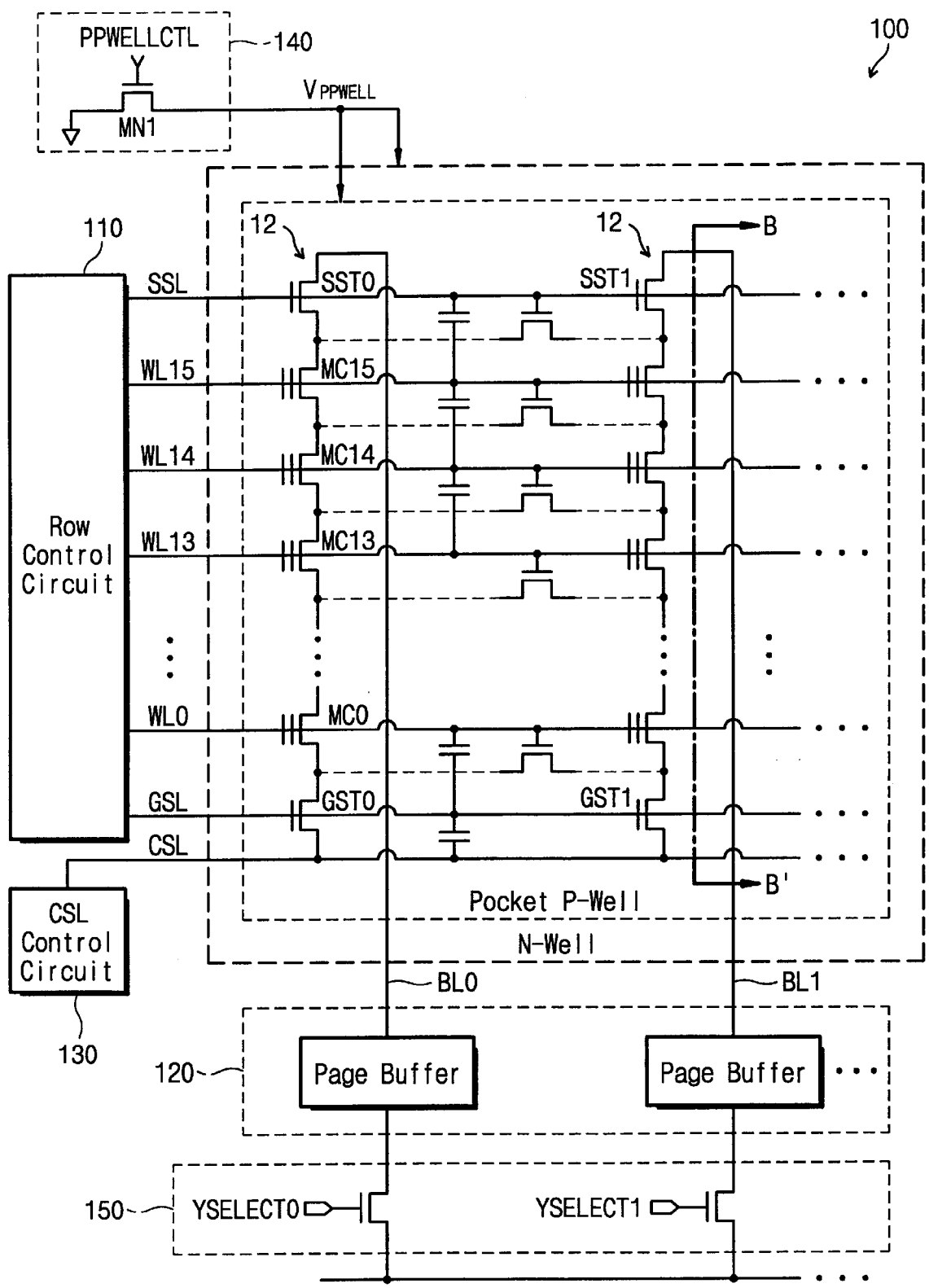
FIG. 1 is a block diagram showing a non-volatile semiconductor memory device according to a first embodiment of the present invention.

FIG. 1 schematically illustrates a NAND-type flash memory device according to a first embodiment of the present invention. The memory device includes a cell array 100, a row control circuit 110, a page buffer circuit 120, a common source line control circuit 130, and a well bias circuit 140. The memory cell array is formed in a pocket P-well area, which is located in an N-well area that is formed in a P-type semiconductor substrate. A memory cell array of a NAND-type flash memory device is made of a plurality of memory blocks that are divided toward a bitline, which is disclosed in U.S. Pat. No. 5,546,341 entitled "NONVOLATILE SEMICONDUCTOR MEMORY" herein incorporated by reference in its entirety. Each of the memory blocks is formed in a corresponding pocket P-well area. For simplicity of the drawings, elements corresponding to only one memory block are shown in FIG. 1. Therefore, a memory cell array shown in FIG. 1 corresponds to a memory block.

In FIG. 1, the memory cell array 100 is composed of a plurality of cell strings or NAND-type strings 12 that are arranged in columns. Each of the strings 12 includes string select transistors SSTm (m=0, 1, 2, . . . , and, i), and is coupled to a string select line SSL. Also, each of the strings 12 includes a ground select transsistor GSTm of which a gate is coupled to a ground select line GSL. A drain of the respective string select transistor SSTm is coupled to a bitline BLm, and a source of the respective ground select transistor GSTm is coupled to a common source line CSL. A string select line SSL, wordlines WLj, and a ground select line GSL are electrically connected to a row control circuit 110.

The row control circuit 110 controls voltages of the select lines SSL and GSL and wordlines WL0–WL15 according to a bitline setup interval, a well bias setup interval, a program interval, and a discharge interval of a program cycle. This will be explained in detail later. The page buffer circuit 120 includes page buffers each corresponding to bitlines BLi. During a read cycle, each page buffer carries out a function to sense data from a selected cell. The sensed data is transferred to a data output buffer (not shown) through a column pass gate circuit 150. During a program cycle, each page buffer carries out a function to temporarily store data applied from an input/output buffer through the column pass gate circuit 150. In other words, each page buffer has the data sense and latch functions.

The common source line CSL is coupled to a common source line control circuit 130 controlling a potential of the common source line CSL during the program cycle, which is explained in detail later. The well bias circuit 140 supplies voltages required in each interval to an N-well area and a pocket P-well area, and is made of, for example, an NMOS transistor MN1. A gate of the NMOS transistor MN1 is coupled to receive a control signal PPWELLCTL, a source thereof is grounded, and a drain thereof is commonly connected to N-well and pocket P-well areas. In other words, the flash memory device according to the first embodiment of the invention has a common well bias configuration.

Figure 2:
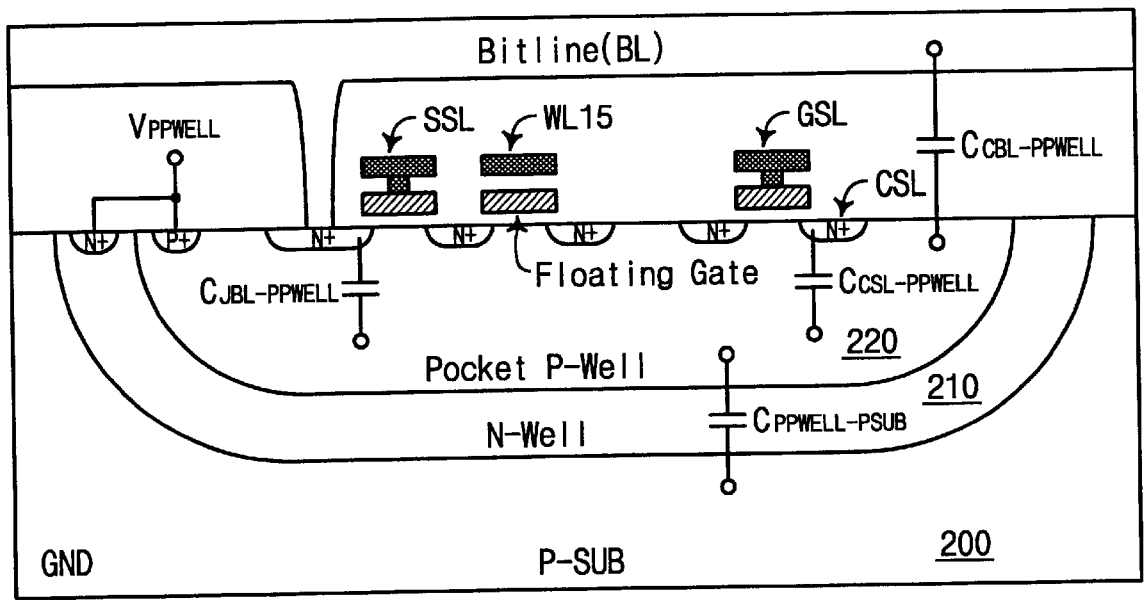
FIG. 2 is a cross-sectional view taken along a line B–B' of FIG. 1.

Referring to FIG. 2, which is a cross-sectional view taken along a dotted line B–B' of FIG. 1, an N-well area 210 is formed in a P-type semiconductor substrate 200. A pocket P-well area 220 is located in the N-well area 210. Memory cells formed of a floating gate transistor having N-type source and drain regions, a string select transistor, and a ground select transistor are formed in the pocket P-well area 220. The N-well area 210 and the pocket P-well area 220 are commonly biased with a voltage Vppwell that is supplied from a well bias circuit 140. There are a coupling capacitance CCBL-PPWELL and a junction capacitance CJBL-PPWELL between a bitline and the pocket P-well area 220. There is a junction capacitance CCSL-PPWELL between the common source line CSL and the pocket P-well area 220. Also, there is a junction capacitance CPPWELL-PSUB between the pocket P-well area 220 and the substrate 200.

Figure 3:
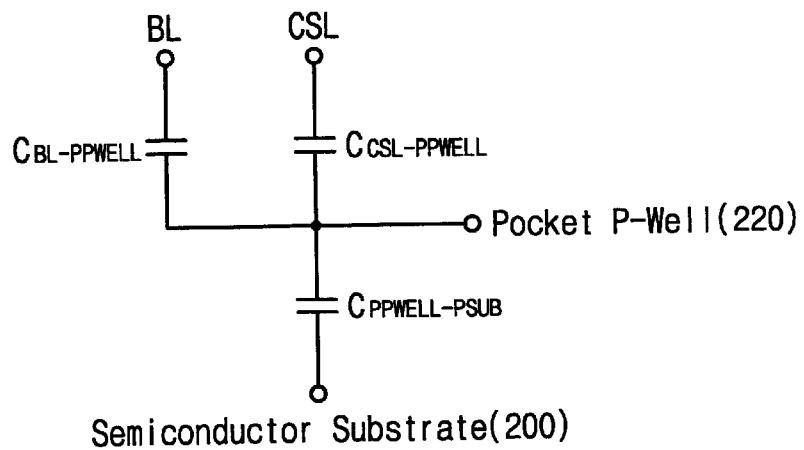
FIG. 3 is an equivalent circuit diagram showing capacitance elements of FIG. 2.

FIG. 3 is an equivalent circuit diagram of capacitance elements shown in FIG. 2. A capacitance CBL-PPWELL between the bitline BL and the pocket P-well area 220 is equal to the sum of the coupling capacitance CCBL-PPWELL and the junction capacitance CJBL-PPWELL. Because it is connected to the pocket P-well area 220 and the N-well area 210, the capacitance CPPWELL-PSUB between the pocket P-well area 220 and the substrate 200 corresponds to a junction capacitance between the N-well area 210 and the substrate 200.

Figure 4:
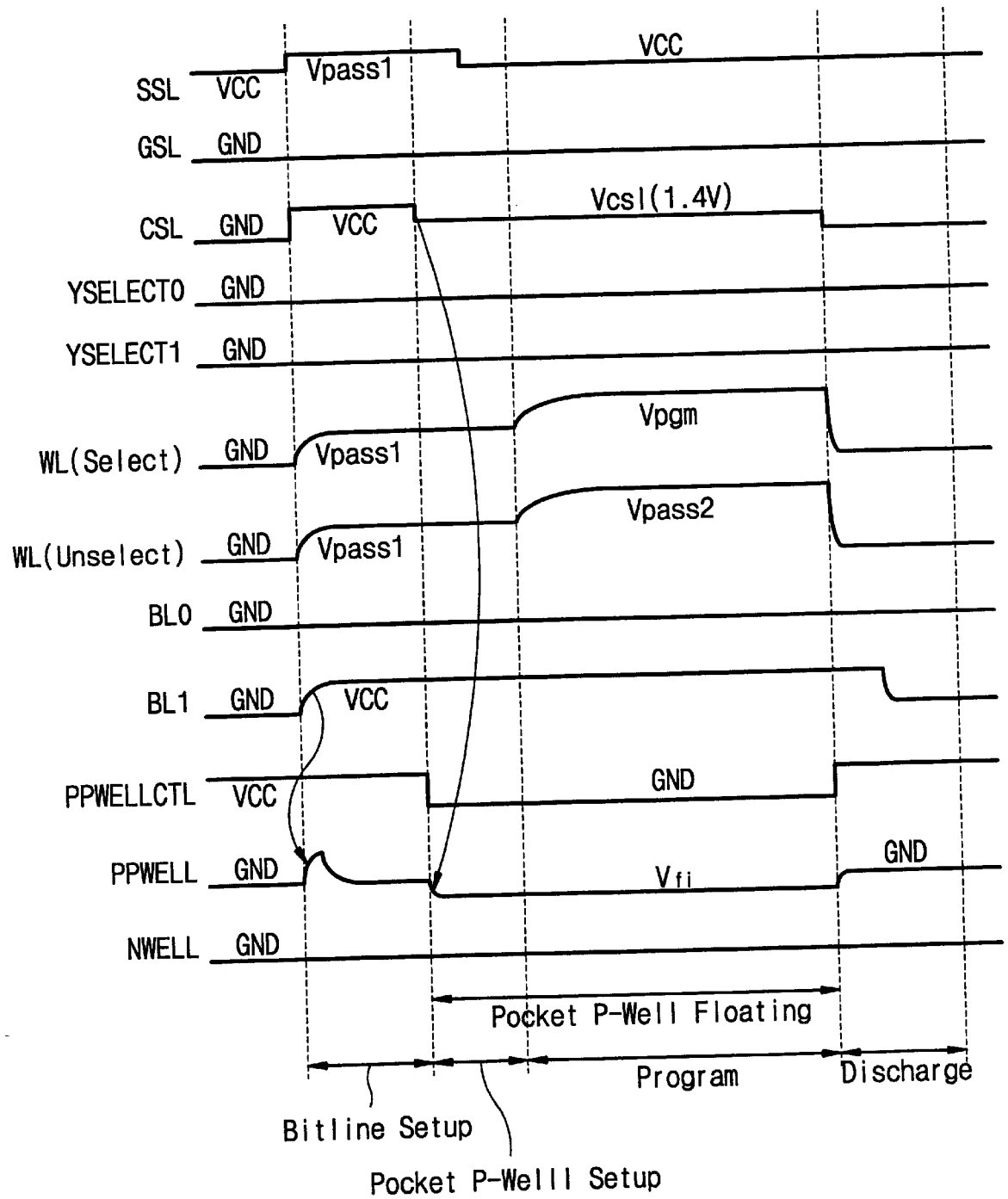
FIG. 4 is an operation timing view for explaining a programming method according to the first embodiment of the present invention.

A programming method according to a first embodiment of the present invention will now be described more fully hereinafter with reference to the accompanying drawings. FIG. 4 is a timing view for explaining a programming operation of a memory device according to the first embodiment of the invention. As explained above, a program cycle is made of a bitline setup interval, a well bias setup interval, a program interval, and a discharge interval. The program cycle may be repeated within the predetermined times. To simplify the explanation, a method of programming a flash memory device will be described using two bitlines BL0 and BL1. Assuming that program data bit "0" and "1" are loaded on page buffers corresponding to the bitlines BL0 and BL1, respectively. The bitline BL0 corresponding to a page buffer holding a "0" data bit is called a select bitline, and the bitline BL1 corresponding to a page buffer holding a "1" data bit is called an unselect bitline.

For a bitline setup interval, a first pass voltage Vpass1 higher than a power supply voltage VCC is applied to a string select line SSL. The power supply voltage VCC is applied to a common source line CSL. And, a ground voltage GND is applied to a ground select line GSL. Since a control signal PPWELLCTL retains a high level of VCC, the N-well 210 and pocket P-well 220 areas are grounded through an NMOS transistor MN1 of the well bias circuit 140. A first pass voltage Vpass1 is applied to all wordlines WL0–WL15. The bitline BL1 is raised to VCC according to a data bit "1" loaded on a corresponding page buffer, while the bitline BL0 retains GND according to a data bit "0" loaded on a corresponding page buffer. When a voltage of the bitline BL1 is raised from GND to VCC, a voltage of the pocket P-well area 220 also raises. The raised voltage quickly falls to GND through the NMOS transistor NM1 of the well bias circuit 140.

In this embodiment, the first pass voltage Vpass1 has a level high enough to turn on a memory cell having a program state or a string select transistor, and meets the following equation.

$$(Vth+VBL) < Vpass1 < Vpass2 \quad \text{[Equation 1]}$$

wherein Vth represents a threshold voltage of a memory cell having a program state, VBL represents a bitline voltage, and VPass2 represents a voltage (hereinafter referred to as "second pass voltage") applied to an unselected wordline in a program interval.

The first pass voltage Vpass1 is applied to the string select line SSL, efficiently charging a channel region of a program inhibit cell in a string corresponding to the bitline BL1 to the power supply voltage VCC. Also, the first pass voltage Vpass1 is applied to all the wordlines WL0–WL15 for a bitline setup interval, obtaining a constant boosting voltage irrespective of previous program state of the other memory cells in the same string (corresponding to the bitline BL1).

In the well bias setup interval subsequent to the bitline setup interval, the pocket P-well area 220 is biased with a negative voltage through a capacitive coupling between the common source line and the pocket P-well area. More specifically, the control signal PPWELLCTL transitions from high level to low level, and the NMOS transistor NM1 of the well bias circuit 140 is turned off. This implies that the pocket P-well area 220 retains a floating state. A voltage of the common source line CSL falls from a power supply voltage VCC to a Vcs1 voltage (e.g., about 1.4 V), as a coupling induction voltage. The Vcs1 is able to prevent a punchthrough of the ground select transistor GSTm. A voltage PPWELL of the pocket P-well area reduces in proportion to a voltage variation (ΔV) of the common source line CSL, and falls to a negative voltage Vfi (e.g., −0.1 V or less), as a coupling voltage, by a capacitance coupling between the common source line CSL and the pocket P-well area 220.

In this case, the voltage Vfi is able to turn off a parasitic MOS transistor when a program voltage is applied to a selected wordline. Alternatively, the voltage Vfi is able to cut off a leakage current flowing through a string select transistor when a program voltage is applied to a selected wordline. The Vfi voltage level is determined by a coupling ratio of the common source line CSL to the pocket P-well area 220.

$$|Vfi| = \frac{C_{CSL-PPWELL}}{(C_{CSL-PPWELL} + C_{BL-PPWELL} + C_{PPWEL-PSUB})} \times \Delta V \quad \text{[Equation 2]}$$

As the pocket P-well area 220 is biased with the negative voltage Vfi, a source-bulk (pocket P-well area) voltage VSB is increased to be as high as the voltage Vfi level. Therefore, threshold voltages of the parasitic MOS transistor and the string select transistor are to be high in proportion to the increased voltage VSB, as known by the following equation $$Vth = V_{FB} + 2\Phi_f + \gamma\sqrt{2\Phi_f + V_{SB}} \quad \text{[Equation 3]}$$

As shown in FIG. 4, a voltage of a string select line SSL retains a first pass voltage Vpass1 until the pocket P-well area 220 is efficiently biased with a negative voltage. This attempts to prevent a capacitance coupling from lowering a voltage of a program inhibit channel or a channel voltage of a string corresponding to a "1" data. When the voltage of the string select line SSL becomes a power supply voltage VCC in a well bias setup interval, a bitline BL1 and a corresponding string 12 are electrically isolated from each other. That is, the string 12 corresponding to the bitline BL1 is floating.

If a practical program operation starts, a program voltage Vpgm is applied to a selected wordline (e.g., WL15), and second pass voltage Vpass2 is applied to unselected wordlines WL0–WL14. A flash EEPROM cell MC15, which is defined by the bitline BL0 and the selected wordline WL15, is programmed by the F-N tunneling effect. Since the cell string 12, which corresponds to the unselected bitline BL1, is floating, a channel voltage of the defined flash EEPROM cell MC15 (i.e., program inhibit cell) is boosted to a voltage enough to prevent F-N tunneling according to a self-boosting mechanism.

Because the pocket P-well area 220 is biased with the negative voltage Vfi, a threshold voltage of a parasitic MOS transistor formed between adjoining memory cells on a selected wordline is higher than the program voltage Vpgm. This makes it possible to turn off the parasitic MOS transistor (or cut off a leakage path through the parasitic MOS transistor), and to retain a boosted channel voltage of a program inhibit memory cell, increased by the self-boosting scheme, without loss. Although a voltage of the string select line is raised as the program voltage Vpgm is applied to an adjacent wordline, the string select transistor retains a shut-off state. This is because a threshold voltage of the string select transistor SSTm increases in proportion to the negative voltage that is biased with the pocket P-well area 220. Consequently, it is possible to prevent a program disturb phenomenon caused by a leakage current flowing through a parasitic MOS transistor and a string select transistor.

After the program operation is completed, for the discharge interval, voltages of bitlines BL0 and BL1 and wordlines WL0–WL15 are discharged, and page buffers are initialized. Owing to the low-to-high transition of a control signal PPWELLCTL for the discharge interval, the pocket P-well area 220 and the N-well area 210 are grounded through the NMOS transistor MN1 of a well bias circuit 140. In this embodiment, the pocket P-well area 220 retains a floating state for the well bias setup interval and the program interval.

Instead of the self-boosting scheme described above, a local self-boosting scheme is applicable to the NAND-type flash memory device of embodiments of the present invention. The local self-boosting scheme is used to prevent an unintentional program (i.e., "program disturb") of an unselected memory cell coupled to a selected wordline. A program inhibit method employing the local self-boosting scheme is disclosed in U.S. Pat. No. 5,715,194 entitled "BIAS SCHEME OF PROGRAM INHIBIT FOR RANDOM PROGRAMMING IN A NAND FLAH MEMORY", and U.S. Pat. No. 6,061,270 entitled "METHOD FOR PROGRAMMING A NON-VOLATILE MEMORY DEVICE WITH PROGAM DISTURB CONTROL".

Figure 5A:
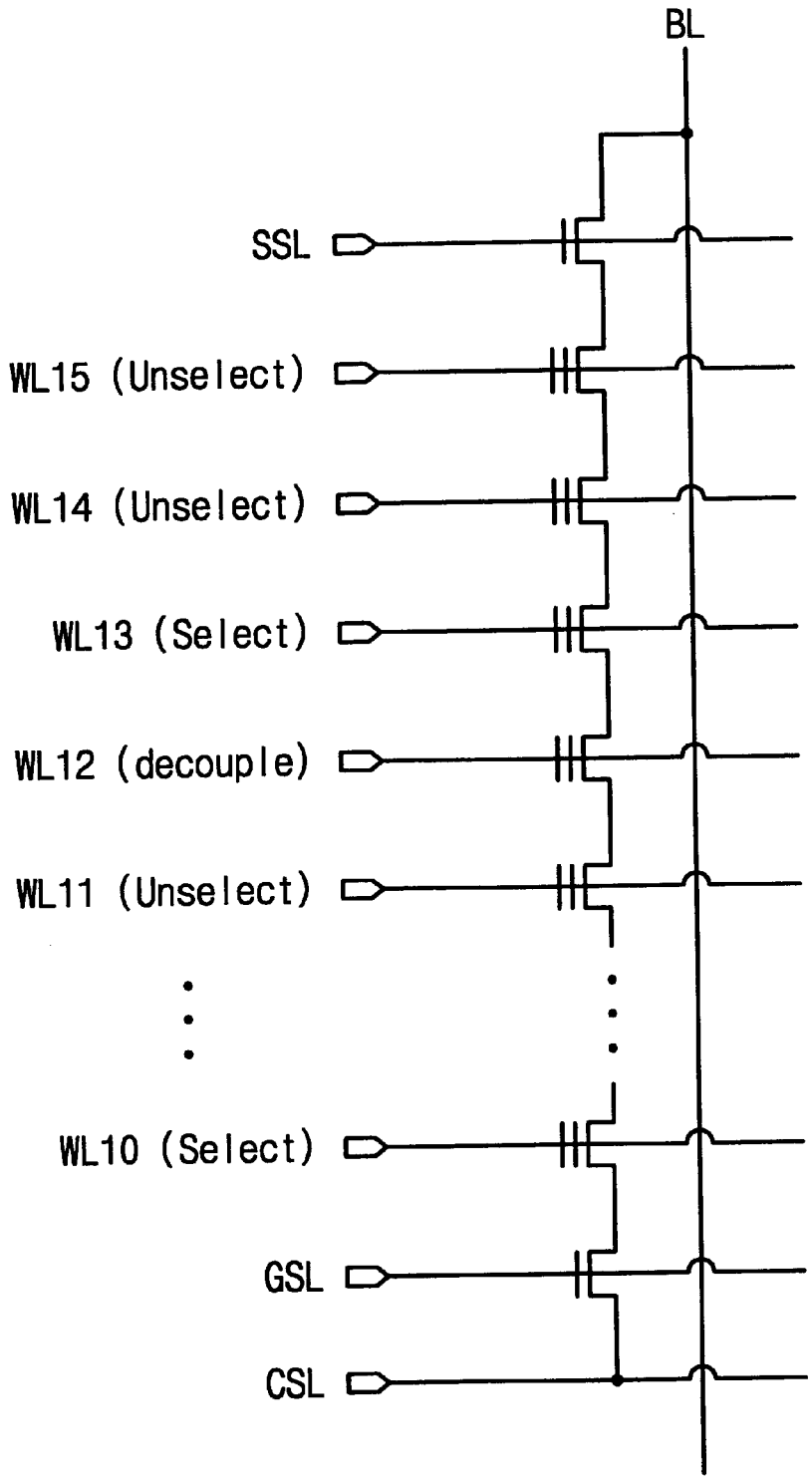
FIG. 5A and FIG. 5B are diagrams illustrating a wordline selecting method according to a local self-boosting scheme.
Figure 5B:
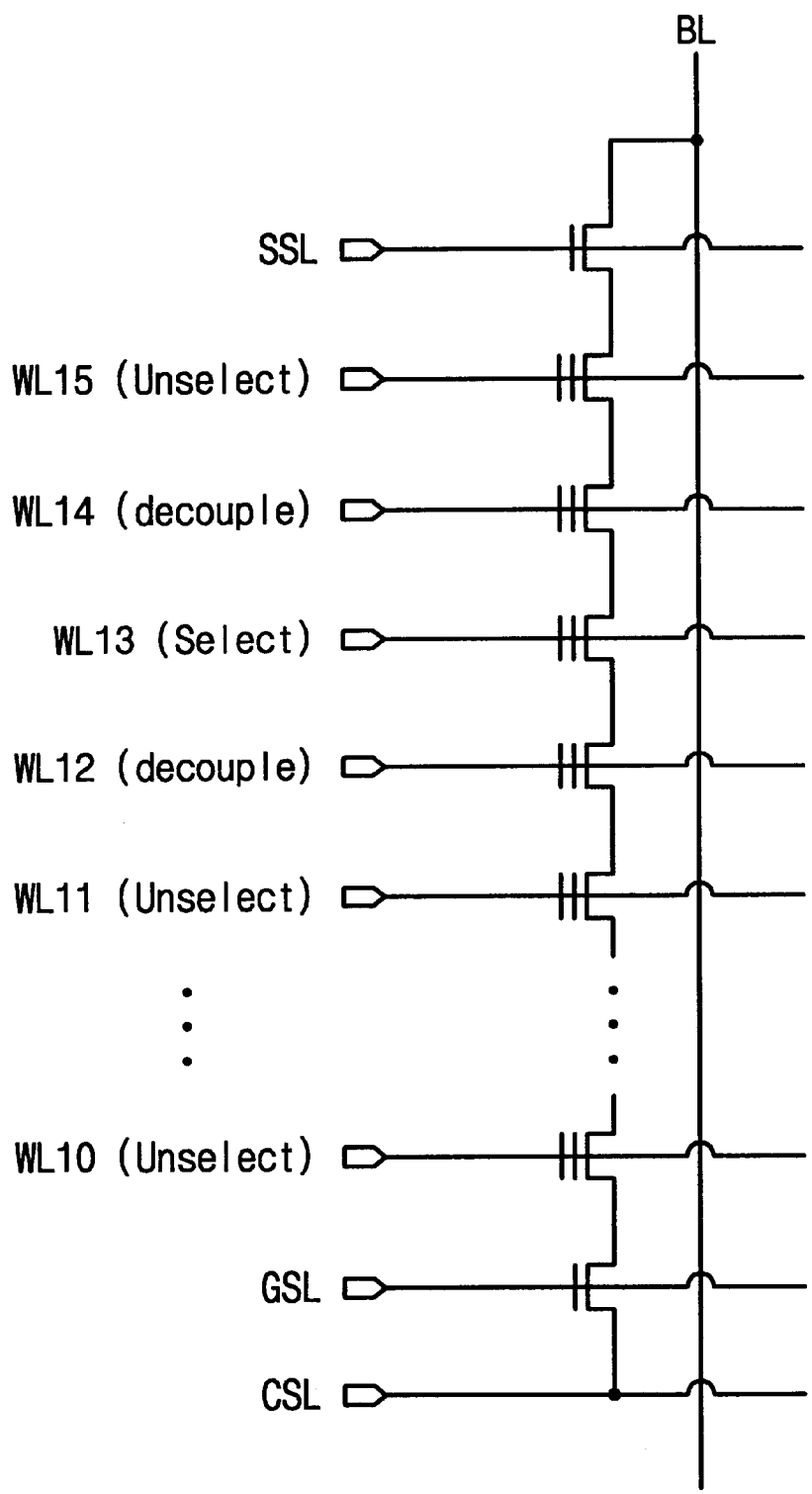
Figure 6:
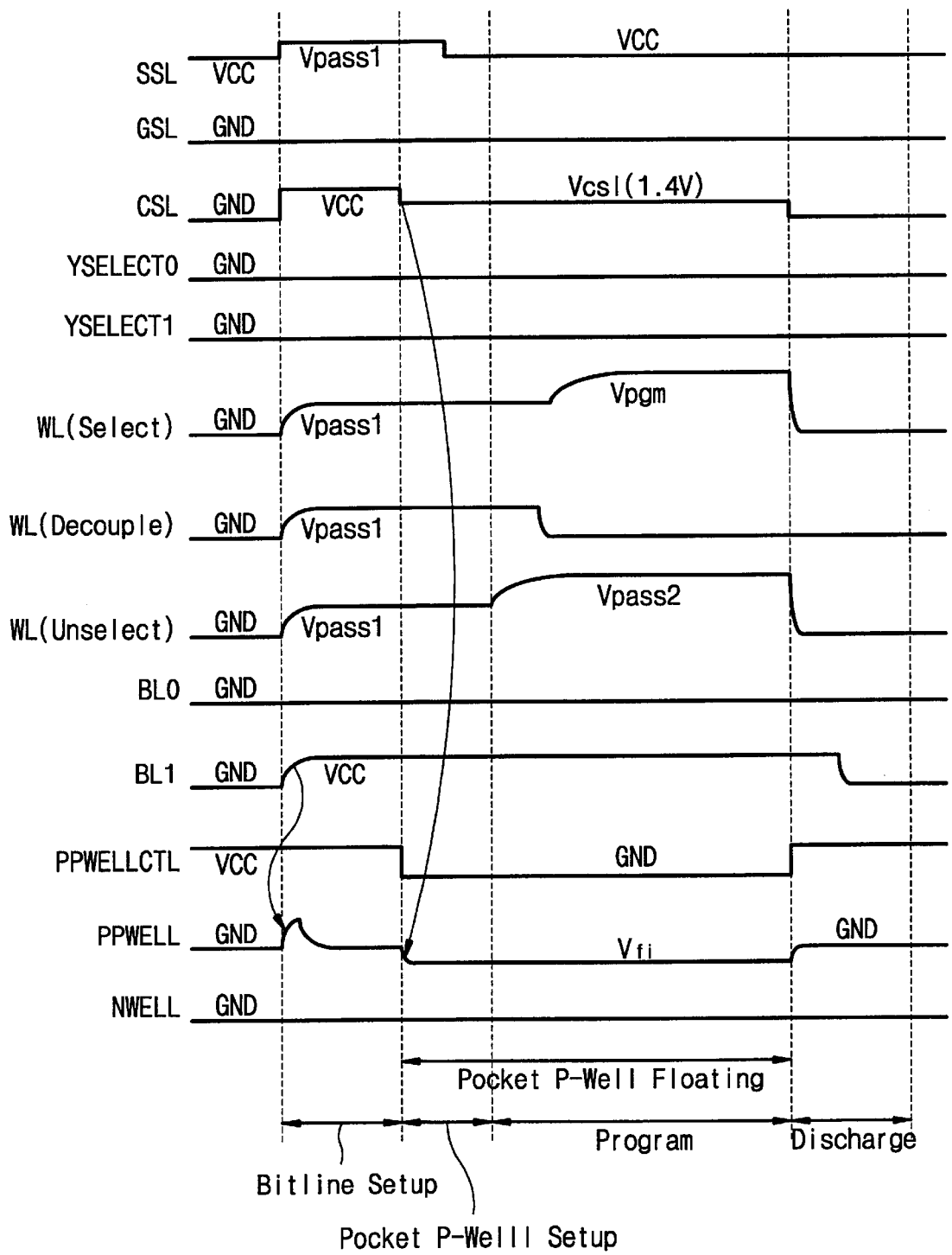
FIG. 6 is an operation timing view showing a local self-boosting operation employing the programming method according to the first embodiment of the present invention.

In the program inhibit method employing the local self-boosting scheme, a voltage of 0 V is applied to two unselected wordlines (hereinafter, referred to as "decouple wordlines") adjacent to a selected wordline, as shown in FIG. 5B. Alternatively, the voltage of 0 V is applied only to the unselected wordline (i.e., decouple wordline) adjacent to the selected wordline, toward a ground select line, as shown in FIG. 5A. After a second pass voltage Vpass2 (e.g., 10 V) is applied to other unselected wordlines, as shown in FIG. 6, a program voltage Vpgm is applied to the selected wordline. Based on such a bias scheme, a channel of a self-boosted cell transistor is limited to a selected wordline. Compared with the program inhibit method using the self-boosting scheme, a channel boosting voltage of a program inhibit cell transistor becomes higher. Therefore, F-N tunneling is not created between the floating gate and a channel of the program inhibit cell transistor. This enables the program inhibit cell transistor to retain its initial erase state.

The local self-boosting scheme also suffers from a program disturb phenomenon that occurs in a program inhibit cell when programming a cell coupled to a wordline adjacent to a string select line SSL. Furthermore, as turning on a parasitic MOS transistor formed between adjoining memory cells on the same wordline, the program disturb phenomenon occurs therein. These problems can be prevented by a programming method according to the first embodiment of the invention.

Figure 7:
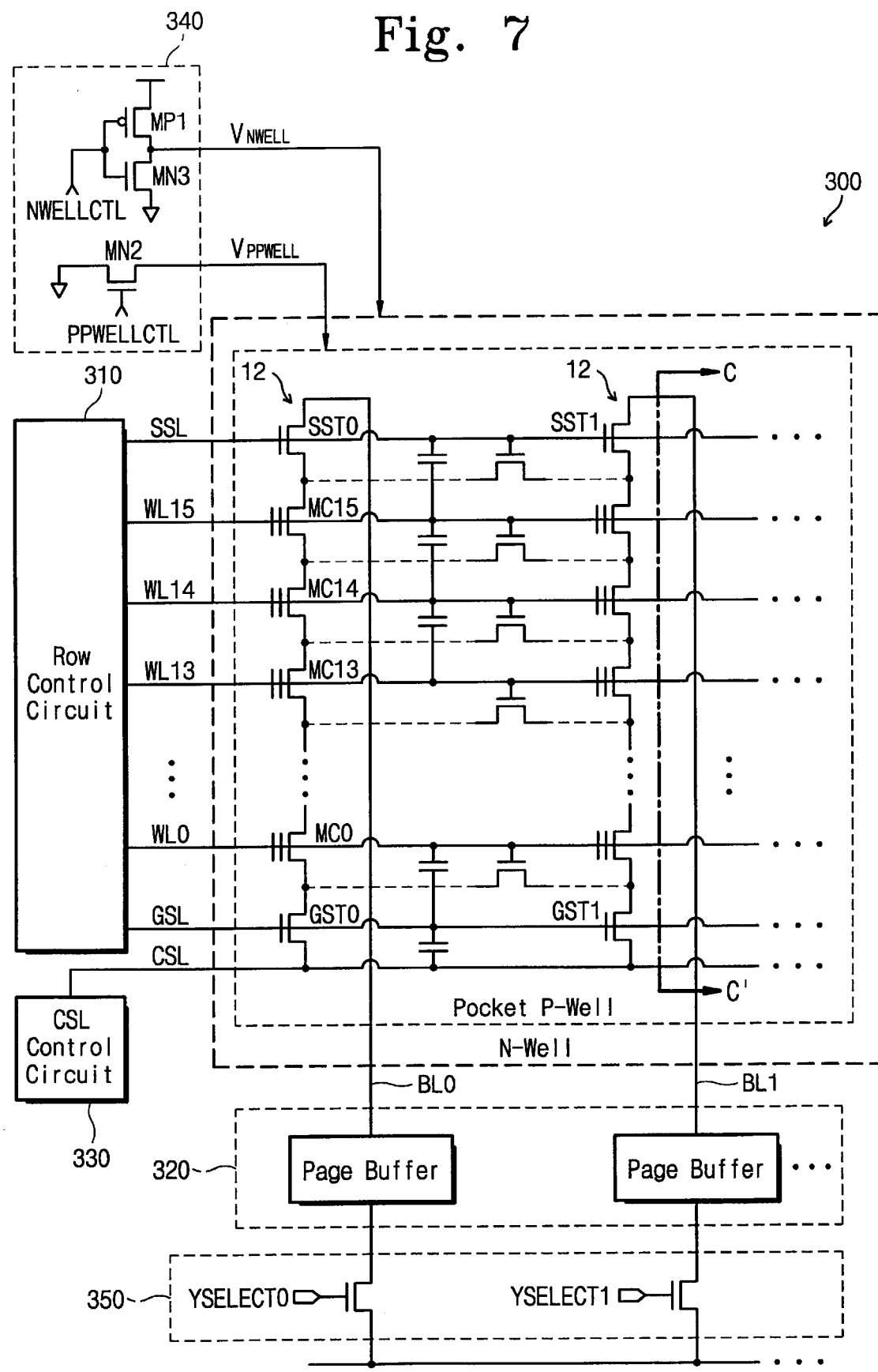
FIG. 7 is a block diagram showing a non-volatile semiconductor memory device according to a second embodiment of the present invention.

FIG. 7 schematically illustrates a NAND-type flash memory device according to a second embodiment of the present invention. The memory device includes a memory cell array 300, a row control circuit 310, a page buffer circuit 320, a common source line control circuit 330, and a well bias circuit 340. The memory cell array 300, the page buffer circuit 320, and a column pass gate circuit 350 are identical to those of the first embodiment.

The row control circuit 310 controls voltages of select lines SSL and GSL and wordlines WL0–WL15 according to a bitline setup interval, a well bias setup interval, a program interval, and a discharge interval of a program cycle. This will be explained in detail later. The common source line control circuit 330 coupled to a common source line CSL controls a voltage of the common source line CSL to retain a Vcs1 voltage (e.g., about 1.4 V) for the well bias setup interval and the program interval.

The well bias circuit 340 supplies a voltage required in each of the intervals, individually to N-well and pocket P-well areas 210, 220. The well bias circuit 340 can be made of, for example, an NMOS transistor MN2 and PMOS and NMOS transistors MP1 and MN3 acting as an inverter. In the NMOS transistor MN2, a gate receives a control signal PPWELLCTL, a source is grounded, and a drain is coupled to the pocket P-well area. The transistors MN3 and MP1 are commonly controlled by a control signal NWELLCTL, and a common drain node thereof is coupled to the N-well area 210. In other words, the N-well and P-well areas are individually biased.

Figure 8:
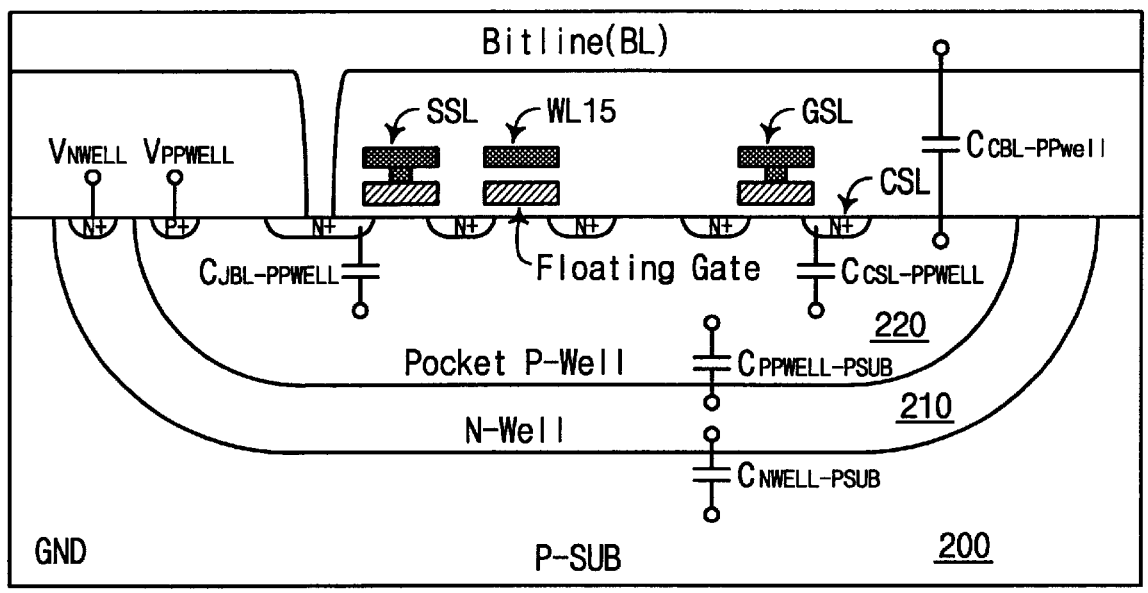
FIG. 8 is a cross-sectional view taken along a line C–C' of FIG. 7.
Figure 9:
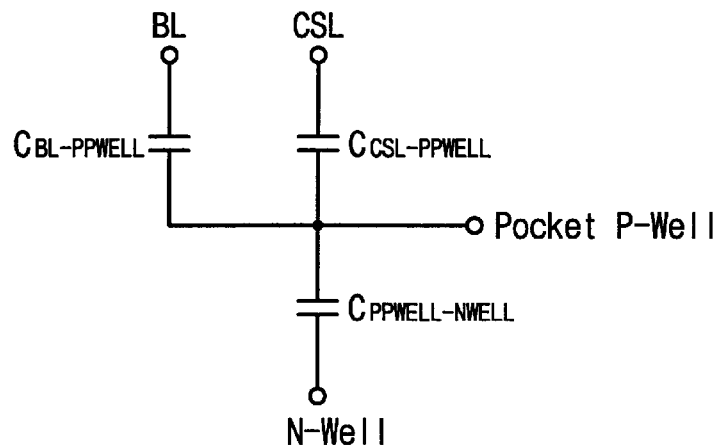
FIG. 9 is an equivalent circuit diagram showing capacitance elements of FIG. 8.

FIG. 8 illustrates capacitance elements based on such a well bias configuration. And, FIG. 9 illustrates an equivalent circuit of the capacitance elements. There are junction capacitance elements CPPWELL-NWELL and CNWELL-PSUB between the pocket P-well area 220 and the N-well area 210, and the N-well area 210 and a semiconductor substrate 200, respectively. In FIG. 9, a capacitance CBL-PPWELL between a bitline and the pocket P-well area 220 is equal to the sum of a coupling capacitance CCBL-PPWELL and a junction capacitance CJBL-PPWELL.

Figure 10:
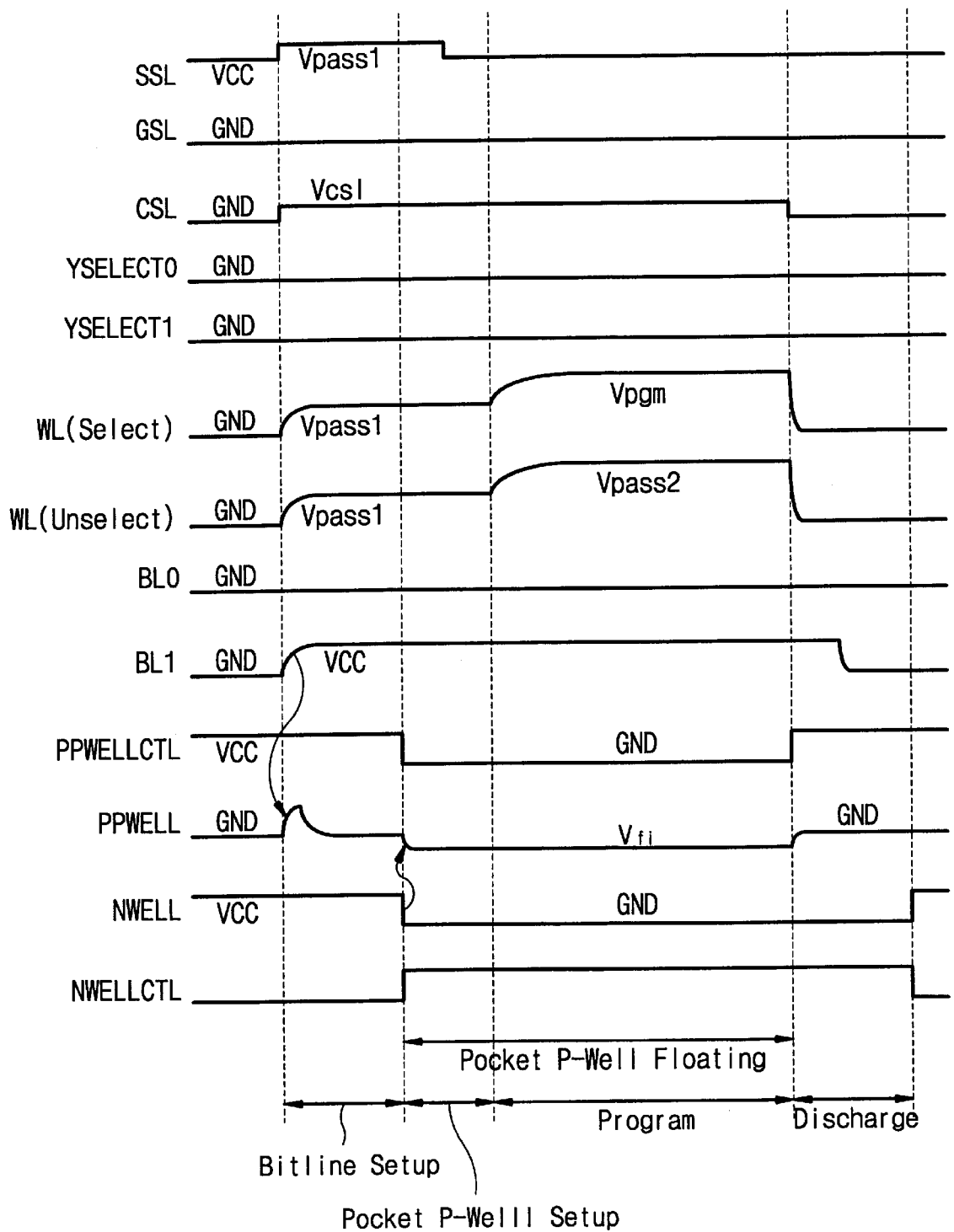
FIG. 10 is an operation timing view for explaining a programming method according to the second embodiment of the present invention.

FIG. 10 shows a timing view for explaining program operations of a memory device according to the second embodiment of the invention. As explained above, a program cycle is composed of a bitline setup interval, a well bias setup interval, a program interval, and a discharge interval, and may be repeated within predetermined times. To simplify the explanation, a method of programming a flash memory device is explained using two bitlines BL0 and BL1. Assuming that program data bits "01" are loaded on page buffers corresponding to the bitlines BL0 and BL1, respectively. The bitline BL0 corresponding to the page buffer holding data bit "0" is called a select bitline, and the bitline BL1 corresponding to the page buffer holding data bit "1" is called an unselect bitline.

For the bitline setup interval, a first pass voltage Vpass1, which is higher than a power supply voltage VCC, is applied to a string select line SSL, a Vcs1 voltage (e.g., about 1.4 V) is applied to a common source line CSL, and a ground voltage GND is applied to a ground select line GSL. The Vcs1 voltage is a voltage able to prevent a punchthrough of a ground select transistor GSTm. Since the control signal PPWELLCTL retains the high level of a power supply voltage VCC, the pocket P-well area 220 is grounded through the NMOS transistor MN2 of the well bias circuit 340. In the second embodiment, a first pass voltage Vpass1 is identical to that in the second embodiment.

Further, since the control signal NWELLCTL retains the low level of a ground voltage GND, the N-well area 210 is connected to the power supply voltage VCC through the PMOS transistor MP1 of the well bias circuit 340. The first pass voltage Vpass1 is applied to all the wordlines WL0–WL15. A bitline BL1 is raised to the power supply voltage VCC in accordance with a data bit "1" that is loaded on a page buffer corresponding to the bitline BL1. On the other hand, the bitline BL0 retains the ground voltage GND in accordance with a data bit "0" that is loaded on a page buffer corresponding to the bitline BL0. When the voltage of the bitline BL1 rises up to the power supply voltage VCC from the ground voltage GND, a voltage of the pocket P-well area 220 is also raised. But, the bounced voltage falls back to the ground voltage GND through the NMOS transistor MN2 of the well bias circuit 340.

In the well bias setup interval subsequent to the bitline setup interval, the pocket P-well area 220 is biased with a negative voltage through a capacitive coupling between the pocket P-well and N-well areas 220, 210. More specifically, the control signal PPWELLCTL transitions from high level to low level, and the NMOS transistor MN2 of the well bias circuit 340 is turned off. This implies that the pocket P-well area 220 retains a floating state. The voltage of the common source line CSL remains at the Vcs1 voltage (e.g., about 1.4 V), which is able to prevent a punchthrough of the ground select transistor GSTm. A voltage PPWELL of the pocket P-well area 220 falls in proportion to a voltage variation (ΔV) of the N-well area 210, and falls to a negative voltage Vfi (e.g., −0.1 V or less), as a coupling voltage, by a capacitive coupling between the N-well area 210 and the pocket P-well area 220.

In this case, the voltage level Vfi is able to turn off a parasitic MOS transistor when a program voltage is applied to a selected wordline. Alternatively, the voltage level Vfi is able to cut off a leakage current flowing through a string select transistor when a program voltage is applied to a selected wordline. The Vfi voltage level is determined by a coupling ratio of the N-well area 210 to the pocket P-well area 220.

$$|Vfi| = \frac{C_{PPWELL-NWELL}}{(C_{CSL-PPWELL} + C_{BL-PPWELL} + C_{PPWEL-NWELL})} \times \Delta V \quad \text{[Equation 4]}$$

As the pocket P-well area 220 is biased with the negative voltage Vfi, a source-bulk (pocket P-well area) voltage VSB is increased to be as high as the voltage Vfi level. Therefore, threshold voltages of the parasitic MOS transistor and the string select transistor are high in proportion to the increased voltage VSB, as known by the above equation [Equation 3].

Similar to the first embodiment, a voltage of the string select line SSL retains the first pass voltage Vpass1 until the pocket P-well area 220 is efficiently biased with a negative voltage. When the voltage of the string select line SSL falls to the power supply voltage VCC, the bitline BL1 and the corresponding string 12 are electrically connected to each other. That is, the string 12 corresponding to the bitline BL1 floats.

If a practical program operation starts, a program voltage Vpgm is applied to a selected wordline (e.g., WL15), and second pass voltage Vpass2 is applied to unselected wordlines WL0–WL14. A flash EEPROM cell MC15, which is defined by the bitline BL0 and the selected wordline WL15, is programmed by the F-N tunneling effect. Since the cell string 12, corresponding to the unselected bitline BL1 is floating, a channel voltage of the defined flash EEPROM cell MC15 (i.e., program inhibit cell) is boosted to a voltage high enough to prevent F-N tunneling according to a self-boosting mechanism.

Because the pocket P-well area 220 is biased with the negative voltage Vfi, a threshold voltage of a parasitic MOS transistor formed between adjoining memory cells on a selected wordline is higher than the program voltage Vpgm. This makes it possible to turn off the parasitic MOS transistor (or cut off a leakage path through the parasitic MOS transistor), and to retain a boosted channel voltage of a program inhibit memory cell, increased by the self-boosting scheme, without loss. Although a voltage of a string select line bounces as the program voltage Vpgm is applied to an adjacent wordline, the string select transistor retains a shut-off state. This is because a threshold voltage of a string select transistor SSTm increases in proportion to the negative voltage that is biased with the pocket P-well area 220. Consequently, it is possible to prevent a program disturb phenomenon caused by a leakage current flowing through a parasitic MOS transistor and a string select transistor.

After the program operation is completed, for a discharge interval, potentials of bitlines BL0 and BL1 and wordlines WL0–WL15 are discharged, and page buffers are initialized. Owing to low-to-high transition of the control signal PPWELLCTL for the discharge interval, the pocket P-well area 220 is grounded through the NMOS transistor MN2 of a well bias circuit 340. The N-well area 210 is similarly grounded through the NMOS transistor MN3. In this embodiment, the pocket P-well area 220 retains a floating state for a well bias setup interval and a program interval.

Figure 11:
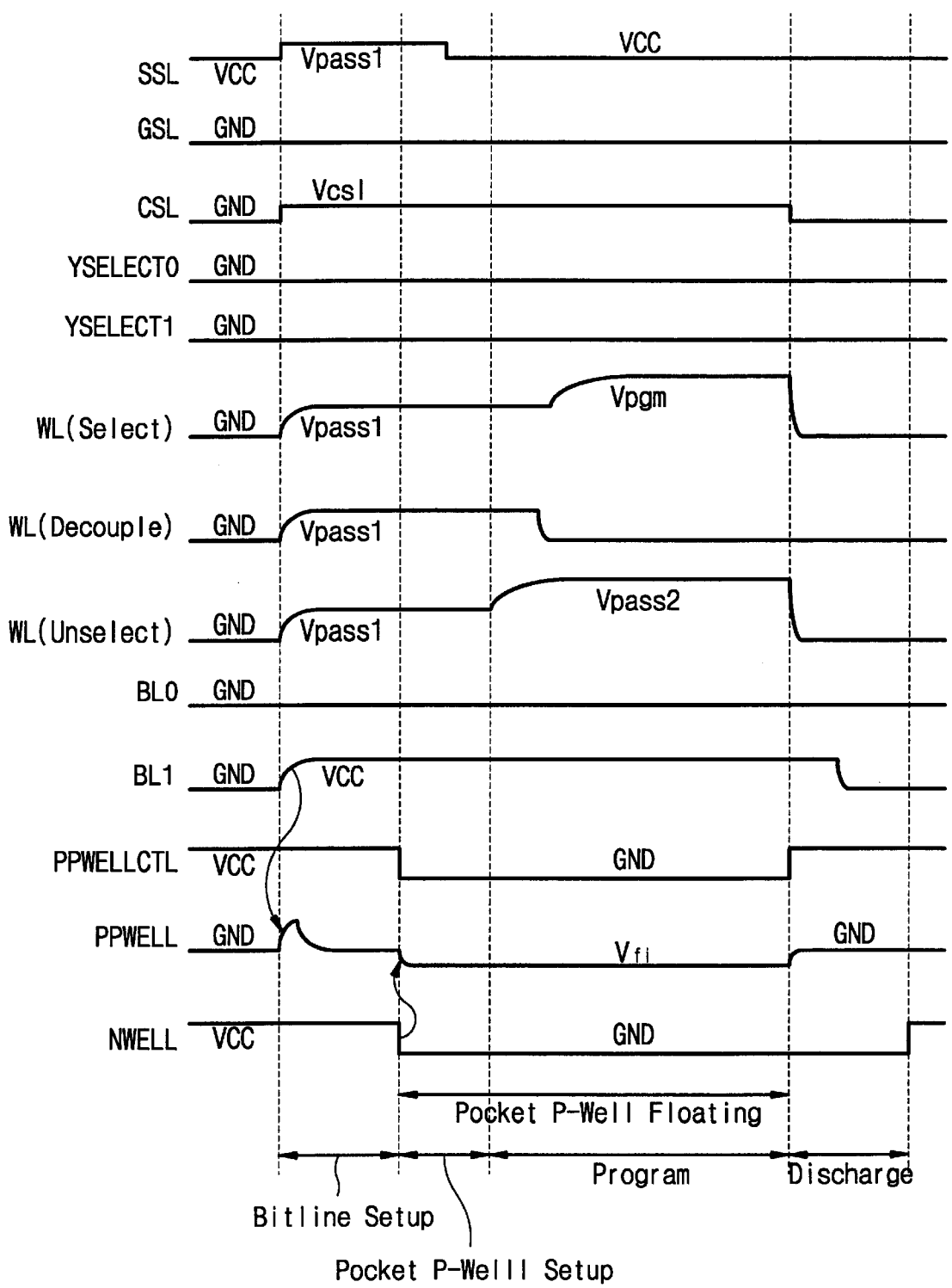
FIG. 11 is an operation timing view showing a local self-boosting operation employing a programming method according to the second embodiment of the present invention.
Figure 12:
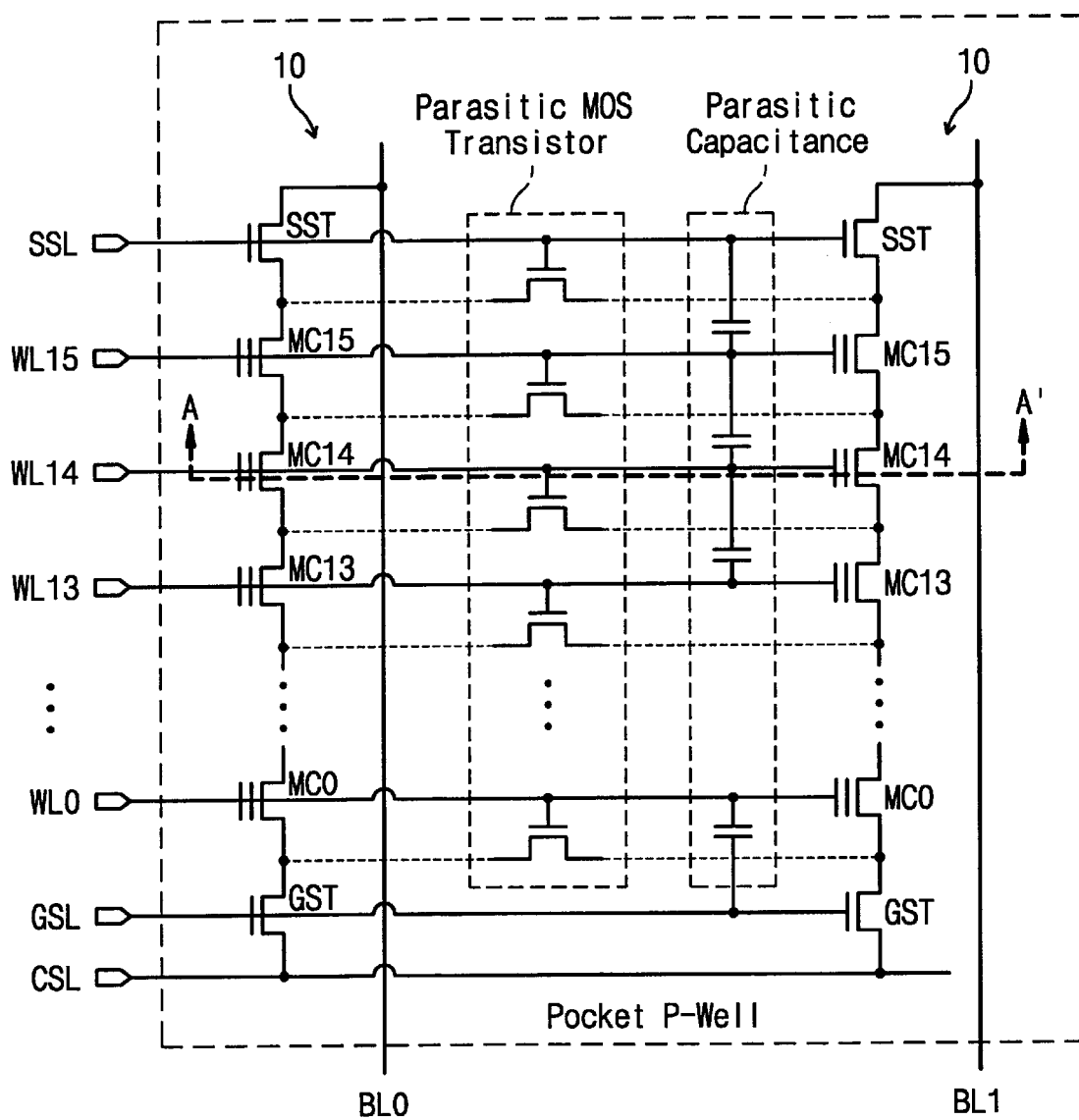
FIG. 12 is a diagram showing an array configuration of a conventional non-volatile semiconductor memory device.
Figure 13:
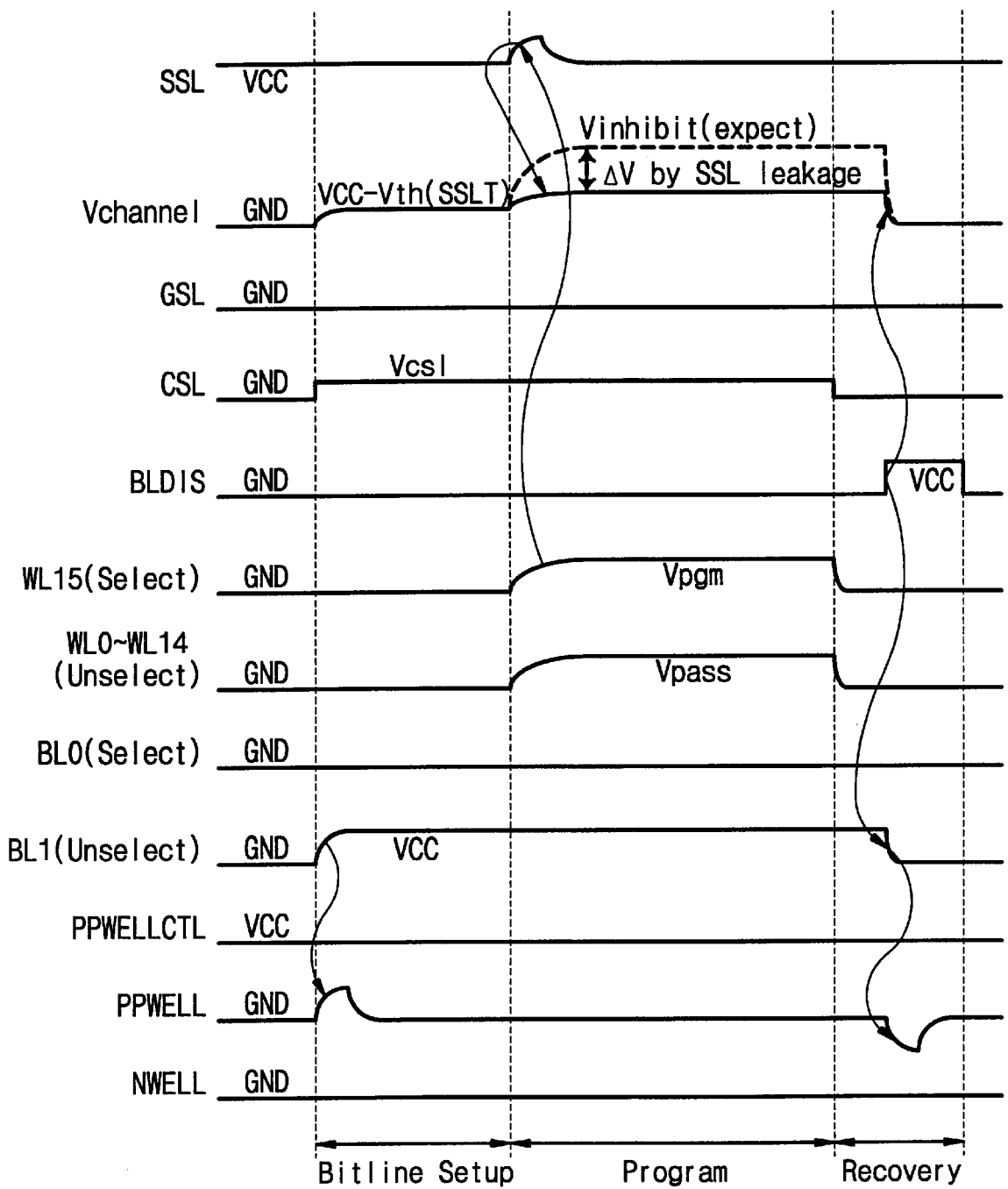
FIG. 13 is an operation timing view for explaining a program disturb phenomenon according to a conventional programming method.
Figure 14:
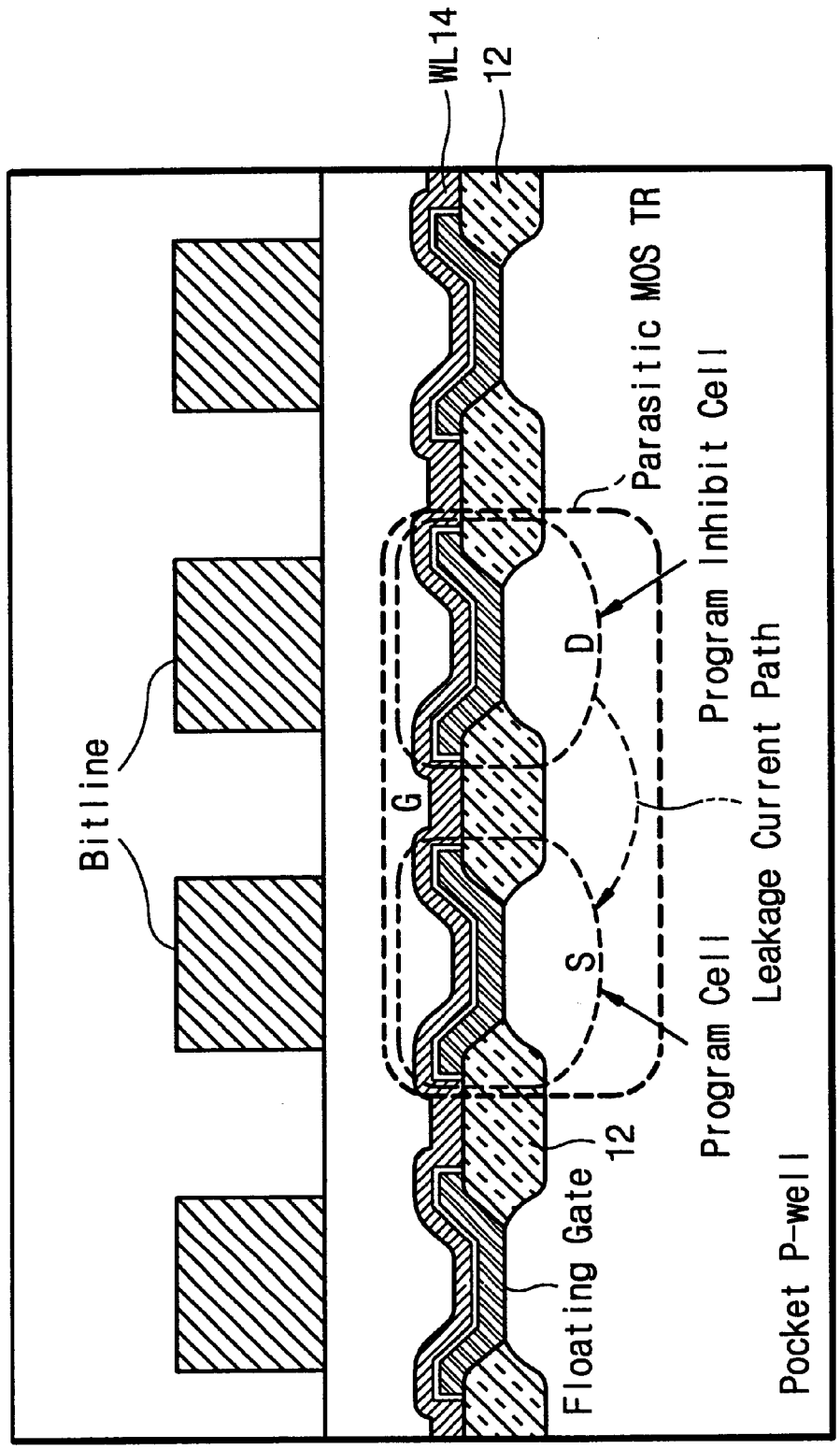
FIG. 14 is a cross-sectional view taken along a dotted line A–A' of FIG. 12.

FIG. 11 is an operation timing view showing a local self-boosting operation employing a programming method according to the second embodiment of the present invention. Note how the wordlines connected to the decoupling transistors fall to the GND voltage in the program cycle. This local self-boosting scheme also suffers from a program disturb phenomenon that occurs in a program inhibit cell when programming a cell coupled to a wordline adjacent to a string select line SSL. As turning on a parasitic MOS transistor formed between adjoining memory cells on the same wordline, the program disturb phenomenon occurs in the program inhibit cell. These problems can be solved by the programming method according to the second embodiment of the invention.

As explained above, a pocket P-well area 220 is biased with a negative voltage using a capacitance coupling for a program cycle, increasing threshold voltages of a parasitic MOS transistor and a string select transistor. Therefore, it is possible to prevent a program disturb phenomenon caused by a leakage current flowing through the parasitic MOS transistor and the string select transistor.

What is claimed is:

1. A method of programming a non-volatile semiconductor memory device including a semiconductor substrate of a first conductive type; a first well area of a second conductive type formed in the semiconductor substrate of the first conductive type; a second well area of the first conductive type formed in the first well area; a memory cell array including a plurality strings, the memory cell array being formed in the second well area, wherein each of the strings is made of a first select transistor having a drain coupled to a corresponding bitline, a second select transistor having a source coupled to a common source line, and a plurality of memory cells serially connected between a source of the first select transistor and a drain of the second select transistor; a first select line commonly connected to first select transistors of the strings; a second select line commonly connected to second select transistors of the strings; a plurality of wordlines each being coupled to memory cells of the respective strings; and page buffers for temporarily storing data bits to be programmed in the memory cell array, the page buffers each being coupled to the bitlines corresponding to the respective bitlines, the method comprising:

supplying one of a first supply voltage and a second supply voltage respectively to the bitlines according to data bits stored in the page buffers, the first supply voltage being lower than the second supply voltage;

biasing the second well area with the first supply voltage;

cutting off the first supply voltage applied to the second well area in order to make the second well area retain a floating state;

biasing the second well area with a coupling voltage lower than the first supply voltage through a coupling capacitance between the second well area and the common source line, and a coupling capacitance between the second well area and the first well area; and supplying a program voltage to one of the plurality of wordlines, while the floating second well area is biased with the coupling voltage.

2. The method of claim 1 wherein the first supply voltage is a ground voltage, and the second supply voltage is a power supply voltage.

3. The method of claim 1 wherein the coupling voltage is a negative voltage.

4. The method of claim 1 wherein the coupling voltage is −0.1 V or less.

5. A method of programming a non-volatile semiconductor memory device including a semiconductor substrate of a first conductive type; a first well area of a second conductive type formed in the semiconductor substrate of the first conductive type; a second well area of the first conductively type formed in the first well area; a memory cell array composed of a plurality strings, the memory cell array being formed in the second well area, wherein each of the strings is made of a first select transistor having a drain coupled to a corresponding bitline, a second select transistor having a source coupled to a common source line, and a plurality of memory cells serially connected between a source of the first select transistor and a drain of the second select transistor; a first select line commonly connected to first select transistors of the strings; a second select line commonly connected to second select transistors of the strings; a plurality of wordlines each being coupled to memory cells of the respective strings, wherein adjoining memory cells coupled to the same wordline are electrically isolated from each other by a field area, wherein, along the same wordline, the adjoining memory cells, and the field area comprises a parasitic MOS transistor, wherein the same wordline acts as a gate of the parasitic MOS transistor, wherein one channel of the adjoining memory cells acts as a drain of the parasitic MOS transistor, and the other channel acts as a source of the parasitic MOS transistor, and wherein the second well area adjacent to the field area between the adjoining memory cells acts as a channel of the MOS transistor; and page buffers for temporarily storing data bits to be programmed in the memory cell array, the method comprising the steps of:

(a) supplying one of first and second supply voltages respectively to the bitlines, with the second well area biased with the first supply voltage, and the common source line biased with the second supply voltage higher than the first supply voltage;

(b) cutting off the first supply voltage applied to the second well area in order to make the second well area achieve a floating state;

(c) lowering the voltage applied to the common source line from the second supply voltage to a coupling induction voltage in order to bias the second well area with a coupling voltage lower than the first supply voltage through a coupling capacitance between the second well area and the common source line; and (d) supplying a program voltage to one of the plurality of wordlines while the floating second well area is biased with the coupling voltage.

6. The method of claim 5 wherein the first supply voltage is a ground voltage, and the second supply voltage is a power supply voltage.

7. The method of claim 6 wherein, for the step (a), a bitline corresponding to a data bit receives the ground voltage, and a bitline corresponding to a data bit indicating retention of a previous state receives the power supply voltage.

8. The method of claim 6 wherein step (a) further includes: applying a first pass voltage to the first select line, the first pass voltage higher than the power supply voltage, and applying the ground voltage to the second select line, the first pass voltage being enough to turn on either a memory cell having a program state or the first select transistor.

9. The method of claim 6 further comprising, during the steps (a) and (b), supplying a first pass voltage to wordlines of the memory cell array, the first pass voltage higher than the power supply voltage.

10. The method of claim 6 wherein a first pass voltage is applied to the first select line during the step (a), and, after the second well area is floating, the power supply voltage is applied to the first select line before the step (d), the first pass voltage higher than the power supply voltage.

11. The method of claim 5 wherein step (d) further comprises: when a program voltage is applied to a selected one of the plurality of wordlines, supplying a second pass voltage to unselected wordlines, the second pass voltage being lower than the program voltage.

12. The method of claim 11 wherein, in the step (d), a ground voltage is applied to an unselected wordline adjacent to the selected wordline located toward the second select transistor before applying the program voltage to the selected wordline, while the second pass voltage is applied to the other unselected wordlines before applying the ground voltage to the unselected wordline.

13. The method of claim 11 wherein, in the step (d), a ground voltage is applied to two unselected wordlines adjacent to top and bottom of the selected wordline, while the second pass voltage is applied to the other unselected wordlines before applying the ground voltage to the unselected wordline.

14. The method of claim 11 further comprising a step of, prior to (d), supplying a ground voltage to the second well area, and discharging voltages of the bitlines to a ground voltage.

15. The method of claim 5 wherein the first and second well areas are formed with a common bias configuration.

16. The method of claim 5 wherein the coupling induction voltage is able to prevent punchthrough of the second select transistor.

17. The method of claim 5 wherein the coupling induction voltage is about 1.4 V.

18. The method of claim 5 wherein the coupling voltage is able to turn off the parasitic MOS transistor when the program voltage is applied to a selected one of the wordlines.

19. The method of claim 5 wherein the coupling voltage is able to cut off the first select transistor when the program voltage is applied to a selected one of the wordlines.

20. The method of claim 5 wherein the coupling voltage is a negative voltage.

21. The method of claim 5 wherein the coupling voltage is a negative voltage of $-0.1$ V or less.

22. The method of claim 5 wherein the step (a) is carried out for a time enough to develop a voltage of a bitline corresponding to a memory cell for retaining data of a previous state to the second supply voltage.

23. In a non-volatile memory device including an array of memory cells formed in a pocket well of a semiconductor substrate, a method of programming the memory cells, comprising:

directly biasing the pocket well with a first biasing voltage;

removing the first biasing voltage to the pocket well and allowing the pocket well to float;

indirectly biasing the floating pocket well; and applying a programming voltage to one or more of the memory cells during a time period in which the pocket well is indirectly biased.

24. The method of claim 23 wherein indirectly biasing the floating pocket well comprises inducing a coupling voltage in the pocket well.

25. The method of claim 23 wherein indirectly biasing the floating pocket well comprises inducing a negative coupling voltage in the pocket well.

26. The method of claim 23 wherein the negative coupling voltage is about $-0.1$ Volts.

27. The method of claim 24 wherein the array of memory cells is formed from a plurality of strings, each string including a first selection transistor coupled to a bitline, a second selection transistor coupled to a common source line, and a plurality of transistor cells coupled between the first selection transistor and the second selection transistor, and wherein inducing a coupling voltage in the pocket well comprises capacitively coupling the common source line and the pocket well.

28. The method of claim 27 wherein capacitively coupling the common source line and the pocket well comprises applying a coupling inducing voltage to the common source line.

29. The method of claim 28 wherein applying a coupling inducing voltage to the common source line comprises applying a voltage of about 1.4 volts to the common source line.

30. The method of claim 23 wherein the pocket well is formed within a second well, and wherein indirectly biasing the floating pocket well comprises inducing a coupling voltage in the pocket well from the second well.

31. The method of claim 29 wherein inducing a coupling voltage in the pocket well from the second well comprises capacitively coupling the second well and the pocket well.

32. The method of claim 30 wherein a pocket well biasing circuit is structured to bias the pocket well, a second well biasing circuit is structured to bias the second well, and wherein inducing a coupling voltage in the pocket well from the second well comprises controlling the second well biasing circuit.

33. The method of claim 32 comprising:

when the pocket well is being biased with a first biasing voltage, biasing the second well with a second biasing voltage; and when the first biasing voltage is removed from the pocket well, biasing the second well with a third biasing voltage.

34. The method of claim 33 wherein the first biasing voltage and the third biasing voltage are the same voltages.

35. The method of claim 33 wherein the first biasing voltage is a power supply voltage, and wherein the second biasing voltage is a reference voltage.

36. In a memory device including an array of non-volatile memory cells formed in a pocket well of a semiconductor substrate, a method of programming the memory cells, comprising:

biasing the pocket well with a first biasing voltage;

removing the first biasing voltage to the pocket well and allowing the pocket well to float;

biasing the floating pocket well with a coupling voltage; and programming one or more of the memory cells after the first biasing voltage has been removed from the pocket well.

37. The method of claim 36 wherein the array of non-volatile memory cells is formed from a plurality of strings, each string including a first selection transistor coupled to a bitline, a second selection transistor coupled to a common source line, and a plurality of transistor cells coupled between the first selection transistor and the second selection transistor, and wherein biasing the floating pocket well with a coupling voltage comprises capacitively coupling the common source line and the pocket well.

38. The method of claim 36 wherein the pocket well is formed within a second well, and wherein biasing the floating pocket well with a coupling voltage comprises inducing a coupling voltage in the pocket well from the second well.

39. The method of claim 36 wherein a pocket well biasing circuit is structured to bias the pocket well, a second well biasing circuit is structured to bias a second well in which the pocket well is formed, and wherein the method further includes:

when the pocket well is being biased with a first biasing voltage, biasing the second well with a second biasing voltage; and when the first biasing voltage is removed from the pocket well, biasing the second well with a third biasing voltage.

40. The method of claim 39 wherein the first biasing voltage and the third biasing voltage are the same voltages.

* * * * *